US010131835B2

(12) United States Patent
Setlur et al.

(10) Patent No.: US 10,131,835 B2
(45) Date of Patent: Nov. 20, 2018

(54) MOISTURE-RESISTANT PHOSPHOR COMPOSITIONS AND ASSOCIATE METHODS

(71) Applicant: GENERAL ELECTRIC COMPANY, Schenectady, NY (US)

(72) Inventors: Anant Achyut Setlur, Niskayuna, NY (US); Robert Joseph Lyons, Niskayuna, NY (US); Prasanth Kumar Nammalwar, Bangalore (IN); James Edward Murphy, Niskayuna, NY (US); Florencio Garcia, Niskayuna, NY (US); Ravikumar Hanumantha, Bangalore (IN)

(73) Assignee: General Electric Company, Schenectady, NY (US)

( * ) Notice: Subject to any disclaimer, the term of this patent is extended or adjusted under 35 U.S.C. 154(b) by 9 days.

(21) Appl. No.: 15/109,267

(22) PCT Filed: Dec. 16, 2014

(86) PCT No.: PCT/US2014/070465
§ 371 (c)(1),
(2) Date: Jun. 30, 2016

(87) PCT Pub. No.: WO2015/102876
PCT Pub. Date: Jul. 9, 2015

(65) Prior Publication Data
US 2016/0376499 A1 Dec. 29, 2016

(30) Foreign Application Priority Data
Dec. 30, 2013 (IN) .......................... 6152/CHE/2013

(51) Int. Cl.
*H01L 33/52* (2010.01)
*C09K 11/02* (2006.01)
(Continued)

(52) U.S. Cl.
CPC .......... *C09K 11/025* (2013.01); *C09K 11/616* (2013.01); *C09K 11/617* (2013.01);
(Continued)

(58) Field of Classification Search
CPC ... C09K 11/025; C09K 11/617; C09K 11/616; H01L 33/502; H01L 33/52; H01L 33/505; H01L 33/507
See application file for complete search history.

(56) References Cited

U.S. PATENT DOCUMENTS 7,358,542 B2  4/2008 Radkov et al.
7,497,973 B2  3/2009 Radkov et al.
(Continued)

FOREIGN PATENT DOCUMENTS

CN  103003388 A  3/2013
EP   2508586 A2  10/2012
(Continued)

OTHER PUBLICATIONS

International Search Report and Written Opinion dated Mar. 23, 2015 which was issued in connection with PCT Patent Application No. PCT/US14/70465 which was filed on Dec. 16, 2014.
(Continued)

*Primary Examiner* — Kyoung Lee

(57) ABSTRACT

A phosphor composition is derived from combining $K_2SiF_6$:$Mn^{4+}$ in solid form with a saturated solution of a manganese-free complex fluoride including a composition of formula I: $A_3[MF_6]$, where A is selected from Na, K, Rb, and combinations thereof and M is selected from Al, Ga, In, Sc, Y, Gd, and combinations thereof. The composition of formula I: $A_3[MF_6]$ has a water solubility lower than a water solubility of $K_2SiF_6$. A lighting apparatus including the phosphor composition is also provided.

16 Claims, 3 Drawing Sheets

(51) Int. Cl.
*C09K 11/61* (2006.01)
*H01L 33/50* (2010.01)

(52) U.S. Cl.
CPC .......... *H01L 33/502* (2013.01); *H01L 33/505* (2013.01); *H01L 33/507* (2013.01); *H01L 33/52* (2013.01)

(56) References Cited

U.S. PATENT DOCUMENTS

| | | | |
|---|---|---|---|
| 7,648,649 B2 | 1/2010 | Radkov et al. | |
| 8,057,706 B1 | 11/2011 | Setlur et al. | |
| 8,252,613 B1 * | 8/2012 | Lyons ................. | C09K 11/617 438/45 |
| 8,377,334 B2 | 2/2013 | Lyons | |
| 8,890,403 B2 | 11/2014 | Sakuta et al. | |
| 2004/0091410 A1 | 5/2004 | Nakane et al. | |
| 2007/0125984 A1 | 6/2007 | Tian et al. | |
| 2009/0162667 A1 | 6/2009 | Radkov | |
| 2012/0261704 A1 | 10/2012 | Meyer et al. | |

FOREIGN PATENT DOCUMENTS

| | | |
|---|---|---|
| JP | 2010144111 A | 7/2010 |
| JP | 2011012091 A | 1/2011 |
| JP | 2011068789 A | 4/2011 |
| JP | 2012178574 A | 9/2012 |
| WO | 2001042385 A2 | 6/2001 |
| WO | 2013121355 A1 | 8/2013 |

OTHER PUBLICATIONS

Zhendong et al. "White light emitting diode by using α-Ca2P2O7:Eu2+, Mn2+ phosphor", Applied Physics letters, IEEE, vol. 90, Issue No. 26, Jun. 27, 2007.

Unofficial English translation of Office Action issued in connection with corresponding CN Application No. 201480071866.X dated Jan. 13, 2017.

* cited by examiner

MOISTURE-RESISTANT PHOSPHOR COMPOSITIONS AND ASSOCIATE METHODS

BACKGROUND

Embodiments of the present invention relate generally to red-emitting phosphors, and particularly moisture-resistant red-emitting phosphors. More particularly, the invention relates to moisture-resistant $K_2SiF_6:Mn^{4+}$, and methods of making the same.

Red-emitting phosphors based on complex fluoride materials activated by $Mn^{4+}$ can be utilized in combination with yellow/green emitting phosphors such as YAG:Ce or other garnet compositions to achieve warm white light (CCTs<5000 K on the blackbody locus, color rendering index (CRI)>80) from a blue LED, equivalent to that produced by current fluorescent, incandescent and halogen lamps. These materials absorb blue light strongly and efficiently emit between about 610-635 nm with little deep red/NIR emission.

While the efficacy and CRI of lighting systems using $Mn^{4+}$ doped fluoride hosts can be quite high, one potential limitation is their susceptibility to degradation under use conditions. It is possible to reduce this degradation using post-synthesis processing steps. However, development of these materials with improved performance and stability may be desirable.

BRIEF DESCRIPTION

In one aspect, the present invention relates to a phosphor composition including particles of $K_2SiF_6:Mn^{4+}$ coated with a manganese-free complex fluoride. The manganese-free complex fluoride includes a composition of formula I: $A_3[MF_6]$, where A is selected from Na, K, Rb and combinations thereof; and M is selected from Al, Ga, In, Sc, Y, Gd and combinations thereof. The composition of formula I: $A_3[MF_6]$ has lower water solubility than a water solubility of $K_2SiF_6$.

In one aspect, a lighting apparatus according to the present invention includes a light source and a phosphor composition radiationally coupled to the light source. The phosphor composition includes particles of $K_2SiF_6:Mn^{4+}$ coated with a manganese-free complex fluoride. The manganese-free complex fluoride includes a composition of formula I: $A_3[MF_6]$, where A is selected from Na, K, Rb and combinations thereof; and M is selected from Al, Ga, In, Sc, Y, Gd and combinations thereof. The composition of formula I: $A_3[MF_6]$ has lower water solubility than a water solubility of $K_2SiF_6$.

In another aspect, the present invention relates to a method for preparing a phosphor composition. The method includes combining a saturated solution of a manganese-free complex fluoride including a composition of formula I: $A_3[MF_6]$, where A is selected from Na, K, Rb, and combinations thereof; and M is selected from Al, Ga, In, Sc, Y, Gd and combinations thereof, with $K_2SiF_6:Mn^{4+}$ phosphor in solid form to form a slurry, wherein the composition of formula I: $A_3[MF_6]$ has a water solubility lower than a water solubility of $K_2SiF_6$. The method further includes filtering the slurry, and isolating a product from the slurry.

In one aspect, the present invention relates to a phosphor composition derived from combining $K_2SiF_6:Mn^{4+}$ in solid form with a saturated solution of a manganese-free complex fluoride including a composition of formula I: $A_3[MF_6]$, where A is selected from Na, K, Rb, and combinations thereof; and M is selected from Al, Ga, In, Sc, Y, Gd, and combinations thereof, wherein the composition of formula I: $A_3[MF_6]$ has a water solubility lower than a water solubility of $K_2SiF_6$.

BRIEF DESCRIPTION OF THE DRAWINGS

These and other features and aspects of the present invention will become better understood when the following detailed description is read with reference to the accompanying drawings, wherein.

DETAILED DESCRIPTION

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value. In the following specification and claims, the singular forms "a", "an" and "the" include plural referents, unless the context clearly dictates otherwise.

As used herein, the term "phosphor", "phosphor composition" or "phosphor material" may be used to denote both a single phosphor composition, as well as a moisture-resistant phosphor composition, and in some embodiments, a coated phosphor composition.

Figure 1:
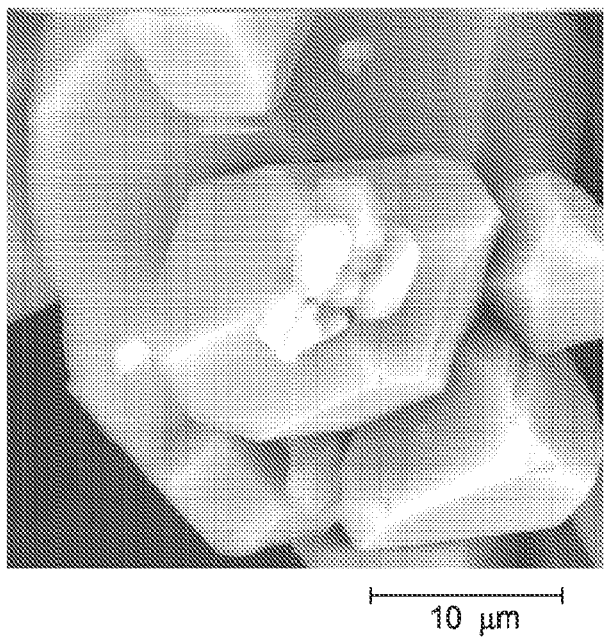
FIG. 1 is a micrograph of $K_2SiF_6:Mn^{4+}$ phosphor composition.
Figure 2:
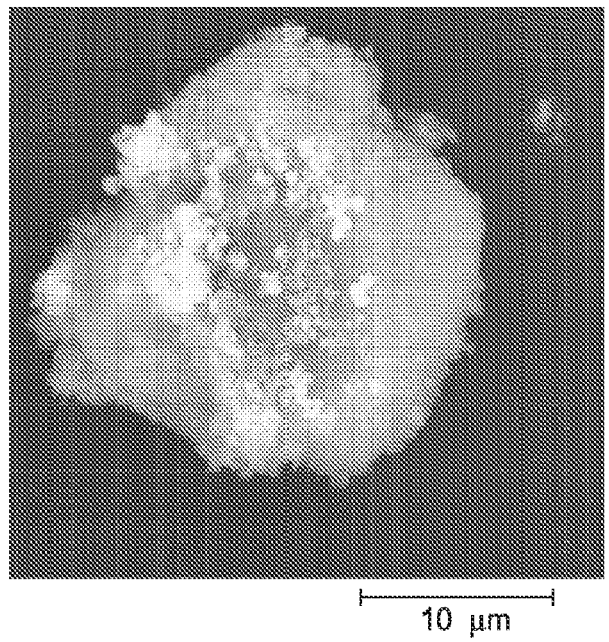
FIG. 2 is a micrograph of a phosphor composition containing particles of $K_2SiF_6:Mn^{4+}$ coated with a manganese-free complex fluoride of formula I, in accordance with one embodiment of the invention.

According to one embodiment of the invention, a phosphor composition is derived from combining $K_2SiF_6:Mn^{4+}$ in solid form with a saturated solution of a manganese-free complex fluoride. The manganese-free complex fluoride includes a composition of formula I: $A_3[MF_6]$, where A is selected from Na, K, Rb and combinations thereof; and M is selected from Al, Ga, In, Sc, Y, Gd, and combinations thereof. In one embodiment, a water solubility of the composition of formula I: $A_3[MF_6]$ is lower than a water solubility of $K_2SiF_6$. The resulting phosphor composition includes coated particles of $K_2SiF_6:Mn^{4+}$ with a manganese-free complex fluoride and thus provides high resistance to moisture-induced degradation. FIGS. 1 and 2, respectively, show micrographs of as prepared $K_2SiF_6:Mn^{4+}$ and the phosphor composition produced by combining $K_2SiF_6:Mn^{4+}$ with a saturated solution 1 including $K_3AlF_6$ as described below with respect to an example. It is clear that the micrograph in FIG. 2 shows substantially coated particles.

It is believed that the phosphor composition may have a core-shell structure. Substantially all of the particles of a core phosphor i.e. $K_2SiF_6:Mn^{4+}$ may be coated with a manganese-free material (also referred to as "shell phosphor"). In an embodiment, the coating may have significantly less degradation under high temperature and high humidity conditions, as compared to the core particles, thereby protecting the core particles from the effects of atmospheric moisture. In embodiments of the present invention, every particle may be covered with the manganese-free complex fluoride. However, if a small number of particles do not become fully covered under processing conditions, the overall characteristics of the phosphor would not be adversely affected for most applications.

As used herein, a complex fluoride is a coordination compound, containing at least one coordination center (for example "M" in the examples above), surrounded by fluoride ions acting as ligands, and charge-compensated by counter ions (e.g. "A" or "E" in the examples above), as necessary. These complex fluorides may further include an activator ion, for example manganese ion ($Mn^{4+}$), and may also be referred as manganese-doped fluoride phosphor. The activator ion ($Mn^{4+}$) also acts as a coordination center, substituting part of the centers of a host lattice, e.g., M. The host lattice (including the counter ions) can further modify the excitation and emission properties of the activator ion.

A variety of manganese-free complex fluorides can be used for coating individual particles of the manganese-doped core fluoride that is $K_2SiF_6:Mn^{4+}$. Furthermore, use of a host composition (for example, $K_2SiF_6$) of the core material may be a desirable choice for the manganese-free coating to avoid mismatching of various features, such as lattice parameters, and refractive index, which otherwise may adversely affect the emission properties of the resulting coated phosphor composition. However, $K_2SiF_6$ may not be suitable coating material for coating $K_2SiF_6:Mn^{4+}$ because of its solubility/reactivity with water. $K_2SiF_6$ may react with water, in particular, and degrade under a humid atmosphere.

As used herein, "water solubility" or "solubility with water" refers to solubility as well as reactivity of a composition with water. In one embodiment, a composition may dissolve in water. In another embodiment, a composition may chemically react with water. For example, $K_2SiF_6$ may not dissolve in water, instead may react with water and produce some precipitates/products.

A number of manganese-free complex fluorides of formula I: $A_3[MF_6]$, where A is selected from Na, K, Rb, Cs, Li, Mg, Ag and combinations thereof; and M is selected from Al, Ga, In, Sc, Y, La, a lanthanide, Bi, and combinations thereof, have been studied for their compatibility to combine with the $K_2SiF_6:Mn^{4+}$ phosphor, for example lattice matching with the host material $K_2SiF_6$, and their solubility in water to analyze their moisture resistivity.

Table 1 shows some examples of manganese-free complex fluoride compositions of formula I along with their lattice parameter and solubility in water (measured as described below with respect to examples). It has been observed that the composition samples 2-7 have lattice parameters comparative with that of $K_2SiF_6$, and may have acceptable lattice matching with $K_2SiF_6$. Furthermore, samples 2, 4 and 7 have lower solubility in water then $K_2SiF_6$.

TABLE 1

| Samples | Phosphor composition | Lattice parameter | Solubility in water |
|---|---|---|---|
| 1 | $K_2SiF_6$ | 8.184 | 11% |
| 2 | $K_3AlF_6$ | 8.405 | 1% |
| 3 | $Na_3AlF_6$ | 7.962 | 12% |

TABLE 1-continued

| Samples | Phosphor composition | Lattice parameter | Solubility in water |
|---|---|---|---|
| 4 | $K_2NaAlF_6$ | 8.122 | 2% |
| 5 | $Rb_3AlF_6$ | 8.5 | — |
| 6 | $NaAg_2AlF_6$ | 7.94 | 22%- |
| 7 | $K_2LiAlF_6$ | | 5.21 |
| 8 | $Na_2LiAlF_6$ | 7.639 | 3.5% |
| 9 | $Li_3AlF_6$ | 11.98 | — |
| 10 | $Cs_2KAlF_6$ | 8.88 | — |
| 11 | $Cs_2RbAlF_6$ | 9.05 | — |
| 12 | $Cs_3AlF_6$ | 9.212 | — |
| 13 | $KMgAlF_6$ | 9.95 | — |

Some embodiments of the invention thus provide a phosphor composition derived from combining $K_2SiF_6:Mn^{4+}$ in solid form with a saturated solution of a manganese-free complex fluoride including a composition of formula I: $A_3[MF_6]$, where A is selected from Na, K, Rb, and combinations thereof; and M is selected from Al, Ga, In, Sc, Y, Gd, and combinations thereof. A may further include Li, Ag, or a combination thereof in about 50 percent amount.

In some embodiments, a phosphor composition includes $K_2SiF_6:Mn^{4+}$ particles coated with a manganese-free complex fluoride includes a composition of formula I: $A_3[MF_6]$, where A is selected from Na, K, Rb, and combinations thereof and M is selected from Al, Ga, In, Sc, Y, Gd, and combinations thereof. In certain embodiments, the manganese-free fluoride includes a composition of formula I: $A_3[AlF_6]$, where A is selected from Na, K, and combinations thereof. Moreover, in some embodiments, the manganese-free complex fluoride composition of formula I: $A_3[MF_6]$ having a lower solubility in water than the solubility of $K_2SiF_6$ in water is desirable. For example, $K_3AlF_6$ and $K_2NaAlF_6$ have lower solubility in water than the solubility of $K_2SiF_6$ in water.

In some embodiments, the manganese-free complex fluoride may further include $K_2SiF_6$. An amount of $K_2SiF_6$ may be added while preparing a saturated solution of the $A_3[MF_6]$ for coating the $K_2SiF_6$ particles that is described in details below.

A variety of methods may be used to prepare manganese-doped or manganese-free fluoride compounds, depending on different starting materials, methods to provide a manganese activator in the proper oxidation state, and the like.

The moisture-resistant coated $K_2SiF_6:Mn^{4+}$ phosphor composition provided by embodiments of the present invention has an intense red luminescence property for electromagnetic excitations corresponding to the various absorption fields of the product. These phosphors may be used in lighting or display systems. One embodiment of the invention is directed to a lighting apparatus that includes the phosphor composition radiationally coupled to a light source.

Figure 3:
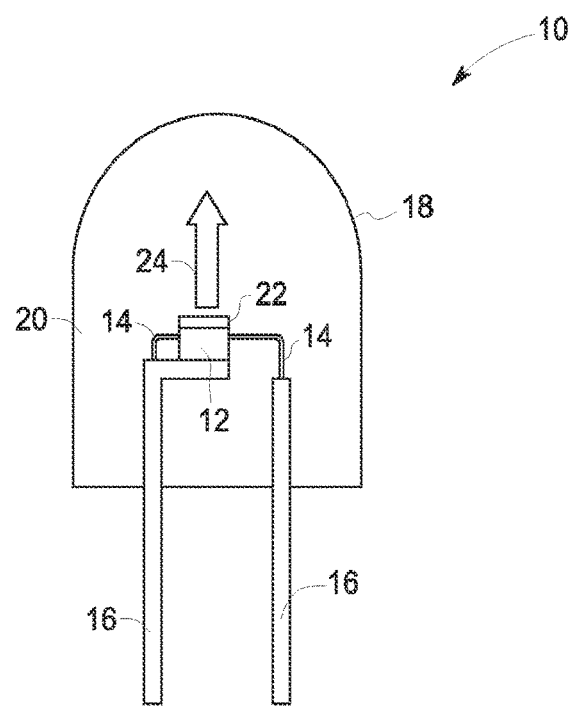
FIG. 3 is a schematic cross-sectional view of a lighting apparatus, in accordance with one embodiment of the invention.

A cross sectional view of a lighting apparatus or light emitting assembly or lamp 10 according to an embodiment of the present invention is shown in FIG. 3. Lighting apparatus 10 includes a semiconductor radiation source, shown as light emitting diode (LED) chip 12, and leads 14 electrically attached to the LED chip. The leads 14 may be thin wires supported by a thicker lead frame(s) 16 or the leads may be self-supported electrodes and the lead frame may be omitted. The leads 14 provide current to LED chip 1 and thus cause it to emit radiation.

LED chip 12 may be any semiconductor blue or ultraviolet light source that is capable of producing white light when its emitted radiation is directed onto a phosphor. In particular, the semiconductor light source may be a blue emitting LED semiconductor diode based on a nitride compound semiconductor of formula $In_iGa_jAl_kN$ (where $0≤i$; $0≤j$; $0≤k$ and $i+j+k=1$) having an emission wavelength greater than about 250 nm and less than about 550 nm. More particularly, the chip 12 may be a near-UV or blue emitting LED having a peak emission wavelength from about 400 to about 500 nm. Even more particularly, the chip 12 may be a blue emitting LED having a peak emission wavelength ranging from about 440-460 nm Such LED semiconductors are known in the art.

Although the general discussion of the exemplary structures of the embodiments of the invention discussed herein are directed toward inorganic LED based light sources, it should be understood that the LED chip may be replaced by an organic light emissive structure or other radiation source, unless otherwise noted, and that any reference to an LED chip or semiconductor is merely representative of any appropriate radiation source.

In lighting apparatus 10, a phosphor material 22 is disposed on a surface of the LED chip 12, and is radiationally coupled to the chip 12. The phosphor material 22 can be deposited on the LED 12 by any appropriate method. The phosphor material 22 includes a composition including coated particles of $K_2SiF_6:Mn^{4+}$ by a layer of manganese-free fluoride phosphor as discussed above. Radiationally coupled means that radiation from LED chip 12 is transmitted to the phosphor, and the phosphor emits radiation of a different wavelength. In a particular embodiment, LED chip 12 is a blue LED, and the phosphor material 22 includes a blend of a red line emitting phosphor according to the aspects of the invention, and a yellow-green phosphor such as a cerium-doped yttrium aluminum garnet, Ce:YAG. The blue light emitted by the LED chip 12 mixes with the red and yellow-green light emitted by the phosphor material 22, and the emission (indicated by arrow 24) appears as white light.

With reference to FIG. 3, the LED chip 12 may be encapsulated within an envelope 18, which encloses the LED chip and an encapsulant material 20. The envelope 18 may be, for example, glass or plastic. The LED chip 12 may be enclosed by the encapsulant material 20. The encapsulant material 20 may be a low temperature glass, or a thermoplastic or thermoset polymer, or resin as known in the art, for example, a silicone or epoxy resin. In addition, scattering particles may be embedded in the encapsulant material 20. The scattering particles may be, for example, alumina or titania. In an embodiment, scattering particles effectively scatter the directional light emitted from the LED chip, with a negligible amount of absorption. In an alternate embodiment, the lamp 10 may only include an encapsulant without an outer envelope 18. The LED chip 12 may be supported, for example, by the lead frame 16, by the self-supporting electrodes, by the base of the envelope 18, or by a pedestal (not shown) mounted to the shell or to the lead frame.

Figure 4:
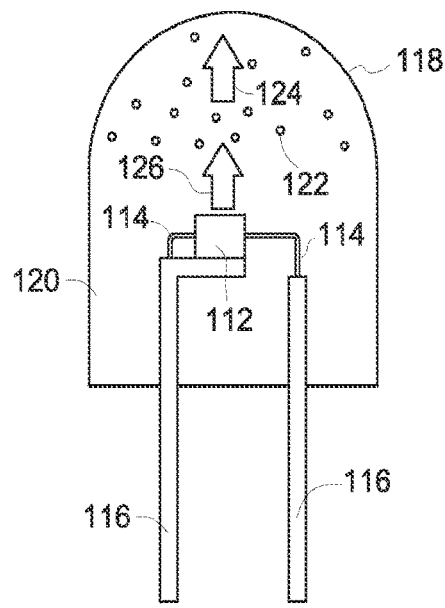
FIG. 4 is a schematic cross-sectional view of a lighting apparatus, in accordance with another embodiment of the invention.

FIG. 4 illustrates another embodiment of a structure of the lighting apparatus according to an aspect of the present invention. Corresponding numbers from FIGS. 3-5 (e.g. 12 in FIGS. 3 and 112 in FIG. 4) relate to corresponding structures in each of the figures, unless otherwise stated. The structure of the embodiment of FIG. 4 is similar to that of FIG. 3, except that the phosphor material 122 is interspersed within the encapsulant material 120, instead of being formed directly on the LED chip 112. The phosphor (in the form of a powder) 122 may be interspersed within a single region of the encapsulant material 120 or, more particularly, throughout the entire volume of the encapsulant material. Radiation (indicated by arrow 126) emitted by the LED chip 112 mixes with the light emitted by the phosphor 122, and the mixed light appears as white light 124. If the phosphor is to be interspersed within the encapsulant material 120, then a phosphor powder may be added to a polymer precursor, and loaded around the LED chip 112. The polymer precursor may then be cured to solidify the polymer. Other known phosphor interspersion methods may also be used, such as transfer molding.

Figure 5:
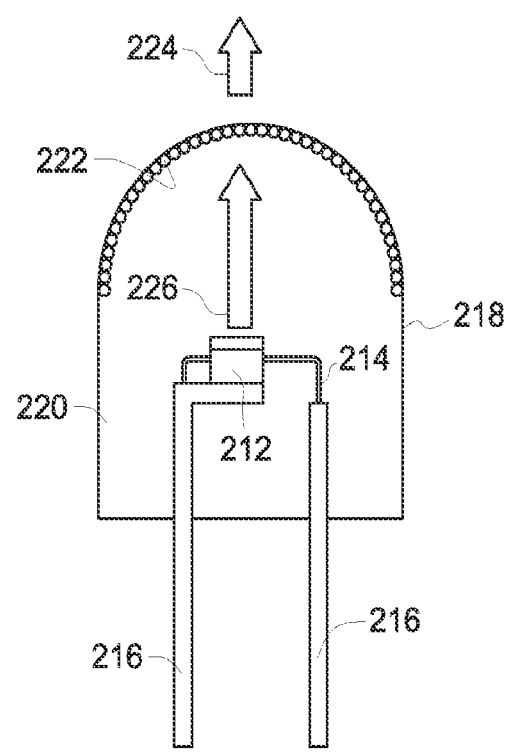
FIG. 5 is a schematic cross-sectional view of a lighting apparatus, in accordance with yet another embodiment of the invention.

FIG. 5 illustrates a third possible structure of the lighting apparatus according to some aspects of the present invention. The structure of the embodiment shown in FIG. 5 is similar to that of FIG. 3, except that the phosphor material 222 is coated onto a surface of the envelope 218, instead of being formed over the LED chip 212. In an embodiment, the phosphor material 222 is coated on the inside surface of the envelope 218, although the phosphor may be coated on the outside surface of the envelope, if desired. The phosphor 222 may be coated on the entire surface of the envelope, or only a top portion of the surface of the envelope. The radiation 226 emitted by the LED chip 212 mixes with the light emitted by the phosphor 222, and the mixed light appears as white light 224. Of course, the structures of FIGS. 3-5 may be combined, and the phosphor may be located in any two or all three locations, or in any other suitable location, such as separately from the envelope, or integrated into the LED.

In some embodiments, the phosphor material includes some additional phosphors to produce color point, color temperature, or color rendering as desired, i.e. a blend of phosphors may be used in the lighting apparatus. When used in a lighting apparatus in combination with a blue or near UV LED emitting radiation in the range of about 250 to 550 nm, the resultant light emitted by the assembly will be a white light. Other phosphors such as green, blue, orange, or other color phosphors may be used in the blend to customize the white color of the resulting light and produce higher CRI sources.

Suitable phosphors for use along with the coated phosphor composition include, but are not limited to:

$((Sr_{1-z}(Ca, Ba, Mg, Zn)_z)_{1-(x+w)}(Li, Na, K, Rb)_w Ce_x)_3 (Al_{1-y}Si_y)O_{4+y+3(x-w)}F_{1-y-3(x-w)}$, $0<x≤0.10$, $0≤y≤0.5$, $0≤z≤0.5$, $0≤w≤x$;

$(Ca, Ce)_3Sc_2Si_3O_{12}$ (CaSiG);

$(Sr,Ca,Ba)_3Al_{1-x}Si_xO_{4+x}F_{1-x}:Ce^{3+}((Ca, Sr, Ce)_3(Al, Si)(O, F)_5$(SASOF));

$(Ba,Sr,Ca)_5(PO_4)_3(Cl,F,Br,OH):Eu^{2+},Mn^{2+}$; $(Ba,Sr,Ca)BPO_5:Eu^{2+},Mn^{2+}$;

$(Sr,Ca)_{10}(PO_4)_6*vB_2O_3:Eu^{2+}$ (wherein $0<v≤1$); $Sr_2Si_3O_8*2SrCl_2:Eu^{2+}$;

$(Ca,Sr,Ba)_3MgSi_2O_8:Eu^{2+},Mn^{2+}$; $BaAl_8O_{13}:Eu^{2+}$; $2SrO*0.84P_2O_5*0.16B_2O_3:Eu^{2+}$;

$(Ba,Sr,Ca)MgAl_{10}O_{17}:Eu^{2+},Mn^{2+}$; $(Ba,Sr,Ca)Al_2O_4:Eu^{2+}$; $(Y,Gd,Lu,Sc,La)BO_3:Ce^{3+},Tb^{3+}$;

$ZnS:Cu^+,Cl^-$; $ZnS:Cu^+,Al^{3+}$; $ZnS:Ag^+,Cl^-$; $ZnS:Ag^+,Al^{3+}$; $(Ba,Sr,Ca)_2Si_{1-ξ}O_{4-2ξ}:Eu^{2+}$ (wherein $0≤ξ≤0.2$); $(Ba,Sr,Ca)_2(Mg,Zn)Si_2O_7:Eu^{2+}$; $(Sr,Ca,Ba)(Al,Ga,In)_2S_4:Eu^{2+}$;

$(Y,Gd,Tb,La,Sm,Pr,Lu)_3(Al,Ga)_{5-α}O_{12-3/2α}:Ce^{3+}$ (wherein $0≤α≤0.5$);

$(Ca,Sr)_8(Mg,Zn)(SiO_4)_4Cl_2:Eu^{2+},Mn^{2+}$; $Na_2Gd_2B_2O_7:Ce^{3+},Tb^{3+}$;

$(Sr,Ca,Ba,Mg,Zn)_2P_2O_7:Eu^{2+},Mn^{2+}$; $(Gd,Y,Lu,La)_2O_3:Eu^{3+},Bi^{3+}$; $(Gd,Y,Lu,La)_2O_2S:Eu^{3+},Bi^{3+}$;

$(Gd,Y,Lu,La)VO_4:Eu^{3+},Bi^{3+}$; $(Ca,Sr)S:Eu^{2+},Ce^{3+}$; $SrY_2S_4:Eu^{2+}$; $CaLa_2S_4:Ce^{3+}$;

$(Ba,Sr,Ca)MgP_2O_7:Eu^{2+},Mn^{2+}$; $(Y,Lu)_2WO_6:Eu^{3+},Mo^{6+}$; $(Ba,Sr,Ca)_βSi_γN_μ:Eu^{2+}$ (wherein $2_β+4_γ=3μ$); $Ca_3(SiO_4)Cl_2:Eu^{2+}$; $(Lu,Sc,Y,Tb)_{2-u-v}Ce_vCa_{1+u}Li_wMg_{2-w}P_w(Si,Ge)_{3-w}O_{12-u/2}$ (where $-0.5≤u≤1$, $0≤v≤0.1$, and $0≤w≤0.2$); $(Y,Lu,Gd)_{2-φ}Ca_φSi_4N_{6+φ}C_{1-φ}:Ce^{3+}$, (wherein $0≤φ≤0.5$);

(Lu,Ca,Li,Mg,Y), α-SiAlON doped with $Eu^{2+}$ and/or $Ce^{3+}$; β-SiAlON:$Eu^{2+}$; (Ca,Sr,)AlSiN$_3$:$Eu^{2+}$(Ca,Sr,Ba)SiO$_2$N$_2$:$Eu^{2+}$,$Ce^{3+}$; 3.5MgO*0.5MgF$_2$*GeO$_2$:$Mn^{4+}$; $Ca_{1-c-f}Ce_c$ $Eu_fAl_{1+c}Si_{1-c}N_3$, (where $0 \le c \le 0.2$, $0 \le f \le 0.2$); $Ca_{1-h-r}Ce_h$ $Eu_rAl_{1-h}(Mg,Zn)_hSiN_3$, (where $0 \le h \le 0.2$, $0 \le r \le 0.2$); $Ca_{1-2s-t}Ce_s(Li,Na)_sEu_tAlSiN_3$, (where $0 \le s \le 0.2$, $0 \le f \le 0.2$, s+t>0); and $Ca_{1-\square-\square-\phi}Ce_\sigma(Li,Na)_\chi Eu_\phi Al_{1+\sigma-\chi}$ $Si_{1-\sigma+\chi}N_3$, (where $0 \le \sigma \le 0.2$, $0 \le \chi \le 0.4$, $0 \le \phi \le 0.2$).

In particular, suitable phosphors for use in blends with the coated phosphor composition are (Ca, Ce)$_3$Sc$_2$Si$_3$O$_{12}$(CaSiG); (Sr,Ca,Ba)$_3$Al$_{1-x}$Si$_x$O$_{4+x}$F$_{1-x}$:$Ce^{3+}$((Ca, Sr, Ce)$_3$(Al, Si)(O, F)$_5$(SASOF)); (Ba,Sr,Ca)$_2$Si$_{1-\xi}$O$_{4-2\xi}$:$Eu^{2+}$ (wherein $0 \le \xi \le 0.2$); (Y,Gd,Tb,La,Sm,Pr,Lu)$_3$(Al,Ga)$_{5-\alpha}$O$_{12-3/2\alpha}$:$Ce^{3+}$ (wherein $0 \le \alpha \le 0.5$); (Ba,Sr,Ca)$_\beta$Si$_\gamma$N$_\mu$:$Eu^{2+}$ (wherein $2\beta+4\gamma=3\mu$; Y,Lu,Gd)$_{2-\phi}$Ca$_\phi$Si$_4$N$_{6+\phi}$C$_{1-\phi}$:$Ce^{3+}$, (wherein $0 \le \phi \le 0.5$); β-SiAlON:$Eu^{2+}$; and (Ca,Sr,)AlSiN$_3$:$Eu^{2+}$.

More particularly, a phosphor that emits yellow-green light upon excitation by the LED chip may be included in a phosphor blend with a coated phosphor composition, for example a Ce-doped YAG, (Y,Gd,Tb,La,Sm,Pr,Lu)$_3$(Al, Ga)$_{5-x}$O$_{12-3/2x}$:$Ce^{3+}$ (wherein $0 \le x \le 0.5$).

The ratio of each of the individual phosphors in the phosphor blend may vary depending on the characteristics of the desired light output. The relative proportions of the individual phosphors in the various embodiment phosphor blends may be adjusted such that when their emissions are blended and employed in an LED lighting device, there is produced visible light of predetermined x and y values on the CIE chromaticity diagram. Light produced, for instance, may possess an x value in the range of about 0.30 to about 0.55, and a y value in the range of about 0.30 to about 0.55. As stated, however, the exact identity and amounts of each phosphor in the phosphor composition can be varied according to the needs of the end user.

One embodiment provides a method of preparing a phosphor composition. The method includes combining K$_2$SiF$_6$:$Mn^{4+}$ particles with manganese-free complex fluoride including a composition of formula I: A$_3$[MF$_6$], where A is selected from Na, K, Rb, and combinations thereof; and M is selected from Al, Ga, In, Sc, Y, Gd, and combinations thereof. A saturated solution of manganese-free fluoride of formula I can first be prepared in an acid. Examples of the acid used to prepare the saturated solution may include HF, HCl, NH$_4$HF$_2$, NH$_4$F or a combination thereof. In some instances, an amount of K$_2$SiF$_6$ may further be added to the solution to neutralize excess acid. Usually, about 30 weight percent of K$_2$SiF$_6$ may be added. The solution may further be filtered to remove any excess acid, undissolved fluoride compositions, or both. The saturated solution is then combined with solid form of K$_2$SiF$_6$:$Mn^{4+}$ phosphor, and stirred for a period of time to form a slurry. The method further includes filtering and washing steps for isolating a product before drying. The washing step may include washing the product with acetone to avoid a browning effect. The product can then be dried to recover a resulting phosphor composition. The product may be dried in a dry box atmosphere to recover or produce a powder of the resulting phosphor composition which may have coated particles of K$_2$SiF$_6$:$Mn^{4+}$. The drying of the product may be carried out at about 10 degrees Celsius to about 300 degrees Celsius, and more specifically at about 50 degrees Celsius to about 200 degrees Celsius.

EXAMPLES

The example that follows is merely illustrative, and should not be construed to be any sort of limitation on the scope of the claimed embodiments.

K$_3$AlF$_6$, K$_2$NaAlF$_6$ and manganese-doped K$_2$SiF$_6$ were prepared according to a procedure described in the referenced U.S. Pat. No. 7,497,973, in a HF solution with a drying temperature of about 70 degrees Celsius.

Solubility test: 0.1 grams of each of K$_3$AlF$_6$ and K$_2$NaAlF$_6$ is combined with 10 milliliters of water. These mixtures were kept for about 24 hours, and then filtered. The filtered amounts of the phosphors were weight again to calculate their solubility in water.

Preparation of a saturated solution 1 including K$_3$AlF$_6$: 15 grams of K$_3$AlF$_6$ was mixed in 100 milliliters of about 48 percent HF in a water bath at 70-90 degrees Celsius to prepare a saturated solution. The solution was filtered to remove any excess K$_3$AlF$_6$.

Preparation of a saturated solution 2 including K$_3$AlF$_6$: 15 grams of K$_3$AlF$_6$ was mixed in 100 milliliters of about 48 percent HF in a water bath at 70-90 degrees Celsius to prepare a saturated solution. The solution was filtered to remove any excess K$_3$AlF$_6$. 4.5 grams of K$_2$SiF$_6$ was mixed in 100 milliliters of the saturated solution of K$_3$AlF$_6$. The solution was again filtered to remove any excess K$_2$SiF$_6$.

Preparation of a saturated solution 3 including K$_2$NaAlF$_6$: 6 grams of K$_2$NaAlF$_6$ was mixed in 100 milliliters of about 48 percent HF in a water bath at 70-90 degrees Celsius to prepare a saturated solution. The solution was filtered to remove any excess K$_2$NaAlF$_6$.

Preparation of a saturated solution 4 including K$_2$NaAlF$_6$: 6 grams of K$_2$NaAlF$_6$ was mixed in 100 milliliters of about 48 percent HF in a water bath at 70-90 degrees Celsius to prepare a saturated solution. The solution was filtered to remove any excess K$_2$NaAlF$_6$. 4.5 grams of K$_2$SiF$_6$ was mixed in 100 milliliters of the saturated solution of K$_2$NaAlF$_6$. The solution was again filtered to remove any excess K$_2$SiF$_6$.

Preparation of phosphor compositions including coated particles of K$_2$SiF$_6$:$Mn^{4+}$: Sample 1: The saturated solution 1 was poured onto 3 grams of K$_2$SiF$_6$:$Mn^{4+}$ powder in a beaker, which was placed in a water bath and, in some instances, in an oil bath. The solution was continuously stirred while pouring. The mixture was stirred at room temperature for about 1 minute to about 5 minutes. The recovered slurry was filtered, and then washed with acetone. The resulting product was finally dried in a dry box atmosphere at about 100 degrees Celsius. Samples 2, 3, and 4 were prepared by using the saturated solution 2, 3, and 4 with the same process as described for sample 1.

Preparation of a Comparative Sample: 15 grams of K$_2$SiF$_6$ was mixed in 100 milliliters of about 48 percent HF in a water bath at 70-90 degrees Celsius to prepare a saturated solution. The solution was filtered to remove any excess K$_2$SiF$_6$. The saturated solution was then combined with 3 grams of K$_2$SiF$_6$:$Mn^{4+}$ powder with the same process as described with respect to the sample 1.

Moisture test: A mixture of water and IPA were prepared by using 25 percent, water with balance IPA. Water and IPA were mixed for 5 minutes in 60 milliliters bottle. 1 gram of each of the samples 1-4 and the comparative sample was separately added to the mixture of IPA and water, and then each of samples 1-4 and the comparative sample was rolled in a rack mill without any media. These samples were then kept for 15 hours.

Thermal stability test: Samples 1-4 and the comparative sample were kept in a copper crucible and subjected to a temperature about 400 degrees Celsius for about 2 hours in argon atmosphere in a quartz furnace.

Spectrometer measurements (Luminescent Intensity measurements): The above samples were then characterized for measuring their luminescent intensity by using a Fluorescent spectrometer. The luminescent intensity was measured at 450 nanometers excitation for all the samples. Table 2 shows luminescent intensity measurements i.e., quantum efficiency (QE) and absorption (Abs) for samples 1-4 and the comparative sample after taking them through the moisture test and thermal stability test. It was observed that the samples 1-4 which included particles of $K_2SiF_6$:$Mn^{4+}$ coated with manganese-free fluorides including $K_3AlF_6$ and $K_2NaAlF_6$, showed quantum efficiency comparative to the comparative sample, which means that the samples 1-4 maintained the luminescent properties of the core phosphor $K_2SiF_6$:$Mn^{4+}$. Furthermore, the samples 1-4 are expected to have high reliability (for example, high stability at high temperatures and humidity conditions) as compared to the manganese-doped core material $K_2SiF_6$:$Mn^{4+}$ and comparative sample because of low solubility of $K_3AlF_6$ and $K_2NaAlF_6$ in water.

TABLE 2

|  | Sample | QE | Abs |
|---|---|---|---|
| After Moisture test | Sample 1 | 101 | 70 |
|  | Sample 2 | 94 | 69 |
|  | Sample 3 | 96 | 72 |
|  | Sample 4 | 104 | 69 |
|  | Comparative sample | 96 | 72 |
| After thermal stability test | Sample 1 | 95 | 59 |
|  | Sample 2 | 107 | 55 |
|  | Sample 3 | 105 | 54 |
|  | Sample 4 | 116 | 50 |
|  | Comparative sample | 98 | 57 |

While only certain features of the embodiments have been illustrated and described herein, many modifications and changes will occur to those skilled in the art. It is, therefore, to be understood that the appended claims are intended to cover all such modifications and changes as fall within the true spirit of the embodiments of the present invention.

The invention claimed is:

1. A phosphor composition comprising particles of $K_2SiF_6$:$Mn^{4+}$ coated with a manganese-free complex fluoride comprising a composition of formula I: $A_3[MF_6]$, where A is selected from Na, K, Rb and combinations thereof; and M is selected from Al, Ga, In, Sc, Y, Gd and combinations thereof,
wherein the manganese-free complex fluoride further comprises $K_2SiF_6$ in an amount less than about 50 weight percent, by weight of the manganese-free fluoride, and
wherein the composition of formula I: $A_3[MF_6]$ has lower water solubility than a water solubility of $K_2SiF_6$.

2. The phosphor composition of claim 1, wherein the manganese-free complex fluoride is of formula I: $A_3[AlF_6]$, where A is selected from Na, K, and combinations thereof.

3. A phosphor composition comprising particles of $K_2SiF_6$:$Mn^{4+}$ coated with a manganese-free complex fluoride comprising a composition of formula I: $A_3[MF_6]$,
where A is selected from Na, K, Rb and combinations thereof; and M is selected from Al, Ga, In, Sc, Y, Gd and combinations thereof,
wherein the composition of formula I: $A_3[MF_6]$ has lower water solubility than a water solubility of $K_2SiF_6$,
wherein the compositions of formula I: $A_3[MF_6]$ having a solubility in water lower than a solubility of $K_2SiF_6$ in water, are $K_3AlF_6$, and $K_2NaAlF_6$.

4. A lighting apparatus comprising:
a light source; and
a phosphor composition radiationally coupled to the light source, the phosphor composition comprising particles of $K_2SiF_6$:$Mn^{4+}$ coated with a manganese-free complex fluoride comprising a composition of formula I: $A_3[MF_6]$, where A is selected from Na, K, Rb, and combinations thereof; and M is selected from Al, Ga, In, Sc, Y, Gd and combinations thereof, wherein the composition of formula I: $A_3[MF_6]$ has lower water solubility than a water solubility of $K_2SiF_6$;
wherein the phosphor composition further comprises at least one of a garnet activated with $Ce^{3+}$, an alkaline earth orthosilicate activated with $Eu^{2+}$, or $(Sr,Ca,Ba)_3(Si,Al)O_4(F,O)$ activated with $Ce^{3+}$.

5. The lighting apparatus of claim 4, wherein the manganese-free complex fluoride comprises a composition of formula I: $A_3[AlF_6]$, where A is selected from Na, K, and combinations thereof.

6. The lighting apparatus of claim 4, wherein the light source is a semiconductor light emitting diode (LED) which emits radiation having a peak wavelength in the range of from about 370 to about 500 nm.

7. The lighting apparatus of claim 4, further comprising an encapsulant material surrounding the light source and the phosphor composition within a housing.

8. The lighting apparatus of claim 4, wherein the phosphor composition is disposed on a surface of the light source.

9. The lighting apparatus of claim 7, wherein the phosphor composition is dispersed in the encapsulant material.

10. A method, comprising:
combining a saturated solution of a manganese-free complex fluoride comprising a composition of formula I: $A_3[MF_6]$, where A is selected from Na, K, Rb, and combinations thereof; and M is selected from Al, Ga, In, Sc, Y, Gd and combinations thereof, with $K_2SiF_6$:$Mn^{4+}$ phosphor in solid form to form a slurry, wherein the composition of formula I: $A_3[MF_6]$ has a water solubility lower than a water solubility of $K_2SiF_6$;
filtering the slurry; and
isolating a product from the slurry; wherein the manganese-free complex fluoride further comprises $K_2SiF_6$ in an amount less than about 50 weight percent, by weight of the manganese-free fluoride.

11. The method of claim 10, wherein preparing the saturated solution comprises preparing the saturated solution in an acid selected from the group consisting of at least HF, HCl, $NH_4HF2$, and $NH_4F$.

12. The method of claim 10, wherein combining comprises pouring the saturated solution onto $K_2SiF_6$:$Mn^{4+}$ in solid form in the vessel with continuous stirring.

13. The method of claim 10, wherein isolating the product comprises drying the slurry.

14. A phosphor composition derived from combining $K_2SiF_6$:$Mn^{4+}$ in solid form with a saturated solution of a manganese-free complex fluoride comprising a composition of formula I: $A_3[MF_6]$, where A is selected from Na, K, Rb, and combinations thereof; and M is selected from Al, Ga, In, Sc, Y, Gd, and combinations thereof,
wherein the composition of formula I: $A_3[MF_6]$ has a water solubility lower than a water solubility of $K_2SiF_6$;
wherein the compositions of formula I: $A_3[MF_6]$ having a solubility in water lower than a solubility of $K_2SiF_6$ in water, are $K_3AlF_6$, and $K_2NaAlF_6$.

15. The phosphor composition of claim 14, wherein the manganese-free complex fluoride comprises a composition of formula I: $A_3[AlF_6]$, where A is selected from Na, K, and combinations thereof.

16. The phosphor composition of claim 14, wherein the manganese-free complex fluoride further comprises $K_2SiF_6$ in an amount less than about 50 weight percent, by weight of the manganese-free fluoride.

* * * * *